(12) United States Patent
Jung et al.

(10) Patent No.: US 11,422,648 B2
(45) Date of Patent: Aug. 23, 2022

(54) BENDABLE DISPLAY DEVICE WITH SENSING ELECTRODE

(71) Applicant: Samsung Display Co., LTD., Yongin-si (KR)

(72) Inventors: Sung Ki Jung, Yongin-si (KR); Nam Hee Park, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

(21) Appl. No.: 17/155,692

(22) Filed: Jan. 22, 2021

(65) Prior Publication Data

US 2021/0365132 A1 Nov. 25, 2021

(30) Foreign Application Priority Data

May 20, 2020 (KR) .................. 10-2020-0060554

(51) Int. Cl.
*G06F 3/041* (2006.01)
*G06F 3/0354* (2013.01)
*H01L 51/00* (2006.01)
*H01L 27/32* (2006.01)

(52) U.S. Cl.
CPC .......... *G06F 3/041* (2013.01); *G06F 3/03545* (2013.01); *G06F 2203/04102* (2013.01); *H01L 27/3244* (2013.01); *H01L 51/0097* (2013.01); *H01L 2251/5338* (2013.01)

(58) Field of Classification Search
CPC .......... G06F 3/041; G06F 3/03545; G06F 2203/04102; H01L 51/0097; H01L 2251/5338; H01L 27/3244
See application file for complete search history.

(56) References Cited

U.S. PATENT DOCUMENTS

| 6,043,810 | A | 3/2000 | Kim et al. |
| 9,176,535 | B2* | 11/2015 | Bohn .................. H04M 1/0268 |
| 9,823,699 | B2* | 11/2017 | Ko ........................ G06F 1/1652 |
| 10,212,811 | B1* | 2/2019 | Zhang ................. H01L 27/3244 |
| 10,347,852 | B2* | 7/2019 | Myeong ................ G06F 1/1616 |
| 10,488,887 | B2* | 11/2019 | Yamazaki ............. F16M 13/00 |
| 2008/0018631 | A1* | 1/2008 | Hioki ................ G02F 1/133526 |
| | | | 345/206 |
| 2012/0307423 | A1* | 12/2012 | Bohn ..................... G06F 1/1652 |
| | | | 361/679.01 |
| 2015/0325804 | A1* | 11/2015 | Lindblad ............... G06F 3/0416 |
| | | | 313/511 |
| 2015/0370287 | A1* | 12/2015 | Ko ........................ G06F 1/1626 |
| | | | 361/749 |

(Continued)

FOREIGN PATENT DOCUMENTS

| CN | 107611161 A | * | 1/2018 | ......... H01L 27/3244 |
| KR | 10-0262725 | | 8/2000 | |

*Primary Examiner* — David D Davis
(74) *Attorney, Agent, or Firm* — Kile Park Reed & Houtteman PLLC

(57) ABSTRACT

A display device includes a bendable area and non-bendable areas adjacent to the bendable area; a display substrate including transistors and a light emitting element; a sensing layer disposed under the display substrate and including a digitizer; and an adhesive layer disposed between the display substrate and the sensing layer, wherein the adhesive layer includes a first surface facing the sensing layer; and groove patterns recessed from the first surface of the adhesive layer.

20 Claims, 8 Drawing Sheets

(56) References Cited

U.S. PATENT DOCUMENTS

| | | | |
|---|---|---|---|
| 2016/0118616 A1* | 4/2016 | Hiroki | H01L 51/0097 257/40 |
| 2017/0280531 A1* | 9/2017 | Tada | H01L 27/3206 |
| 2018/0101200 A1* | 4/2018 | Myeong | G06F 1/1681 |
| 2018/0151644 A1* | 5/2018 | Han | H01L 27/3244 |
| 2019/0049326 A1* | 2/2019 | Li | G06F 3/045 |
| 2019/0129553 A1* | 5/2019 | Oh | G06F 3/041 |
| 2020/0183457 A1* | 6/2020 | Youn | G06F 1/1652 |
| 2020/0185641 A1* | 6/2020 | Jeong | H01L 51/0097 |
| 2020/0365827 A1* | 11/2020 | Yamazaki | G09G 5/006 |

* cited by examiner

BENDABLE DISPLAY DEVICE WITH SENSING ELECTRODE

CROSS-REFERENCE TO RELATED APPLICATION(S)

This application claims priority to and benefits of Korean Patent Application No. 10-2020-0060554 under 35 U.S.C. § 119, filed on May 20, 2020 in the Korean Intellectual Property Office, the entire contents of which are incorporated herein by reference.

BACKGROUND

1. Technical Field

The disclosure relates to a display device.

2. Description of the Related Art

With the development of the information society, the demand for various types of display devices for displaying images is increasing. Various flat panel display devices such as a liquid crystal display, a plasma display device, an organic light emitting diode display device, and an electrophoretic display device have been utilized. The liquid crystal display, the organic light emitting diode display device, and the electrophoretic display device may be thin display devices, and thus research has been conducted to apply these to flexible display devices.

A touch panel is an input device that may allow a user to input a command by selecting an instruction displayed on a screen of a display device with a user's finger or an object. Such a touch panel may replace a separate input device operated by being connected to a display device such as a keyboard or a mouse, and thus the application or use of touch panel is gradually expanding.

In general, in a case that a user's finger or an object touches a surface of the touch panel, the touch panel may recognize the touch by a method of recognizing a contact position by detecting a change in capacitance, which may be known as a capacitive type.

On the other hand, in a case that the touch is recognized as the user's finger touches the surface of the touch panel, there may be a disadvantage that the contact position may not be finely recognized. To overcome this problem, research on an electronic pen (or a stylus pen) and a digitizer that may recognize the electronic pen has been actively conducted.

Recently, a sensing layer including a magnetic metal plate and a digitizer module disposed on the magnetic metal plate has been applied to a display device.

The above information disclosed in this background section is only for enhancement of understanding of the background of the disclosure, and therefore it may contain information that does not form the prior art that may already be known to a person of ordinary skill in the art.

SUMMARY

The disclosure has been made in an effort to provide a display device capable of minimizing a phenomenon in which a sensing pattern of a sensing layer may be recognized.

The technical objects of the disclosure are not limited to the objects mentioned above, and other technical objects not mentioned may be clearly understood by those skilled in the art from the description of the claims.

An embodiment provides a display device that may include a bendable area and non-bendable areas adjacent to the bendable area; a display substrate including transistors and a light emitting element; a sensing layer disposed under the display substrate and including a digitizer; and an adhesive layer disposed between the display substrate and the sensing layer, wherein the adhesive layer may include a first surface facing the sensing layer; and groove patterns recessed from the first surface of the adhesive layer.

The sensing layer may include sensing patterns protruding toward the adhesive layer.

The sensing patterns may overlap the groove patterns.

The sensing patterns may directly contact the groove patterns.

A thickness of the sensing patterns in a first direction may be substantially same as a thickness of the groove patterns in the first direction.

A width of the sensing patterns in a second direction intersecting the first direction may be substantially same as a width of the groove patterns in the second direction that intersects the first direction.

The sensing layer may include a base layer; a sensing electrode disposed on the base layer; and an insulating layer disposed on the sensing electrode.

The sensing electrode may overlap the groove patterns.

The sensing layer may sense an input of an electronic pen.

The display device may further include a low reflection layer disposed between the display substrate and the adhesive layer.

The low reflection layer may include at least one of metal, plastic, and glass.

The plastic may be a fiber reinforced plastic.

A first surface of the low reflection layer may contact a second surface of the adhesive layer.

The display device may further include a cover panel disposed between the low reflection layer and the display substrate.

A second surface of the low reflection layer may contact the display substrate.

The display device may further include a metal plate disposed under the sensing layer.

The metal plate may include bendable grooves overlapping the bendable area of the display device.

The non-bendable areas of the display device may include a first non-bendable area and a second non-bendable area and the bendable area may be disposed between the first non-bendable area and the second non-bendable area.

The metal plate may include a first metal plate overlapping the first non-bendable area; and a second metal plate overlapping the second non-bendable area.

The first metal plate and the second metal plate may be spaced apart from each other, and the bendable area may be disposed between the first metal plate and the second metal plate.

Details of other embodiments are included in the detailed description and drawings.

According to an embodiment, an interlayer adhesive force between the sensing layer and the adhesive layer may be improved as the adhesive layer coupled or connected or attached to the sensing layer may include the groove pattern having the shape that may be complementary to the sensing pattern of the sensing layer. Accordingly, bubble generation and pattern visibility due to the sensing pattern of the sensing layer may be minimized, thereby improving the display quality.

Effects according to embodiments are not limited by the contents exemplified above, and more various effects are included in this specification.

BRIEF DESCRIPTION OF THE DRAWINGS

Illustrative, non-limiting embodiments will be more clearly understood from the following detailed description taken in conjunction with the accompanying drawings in which.

DETAILED DESCRIPTION OF THE EMBODIMENTS

Figure 1:
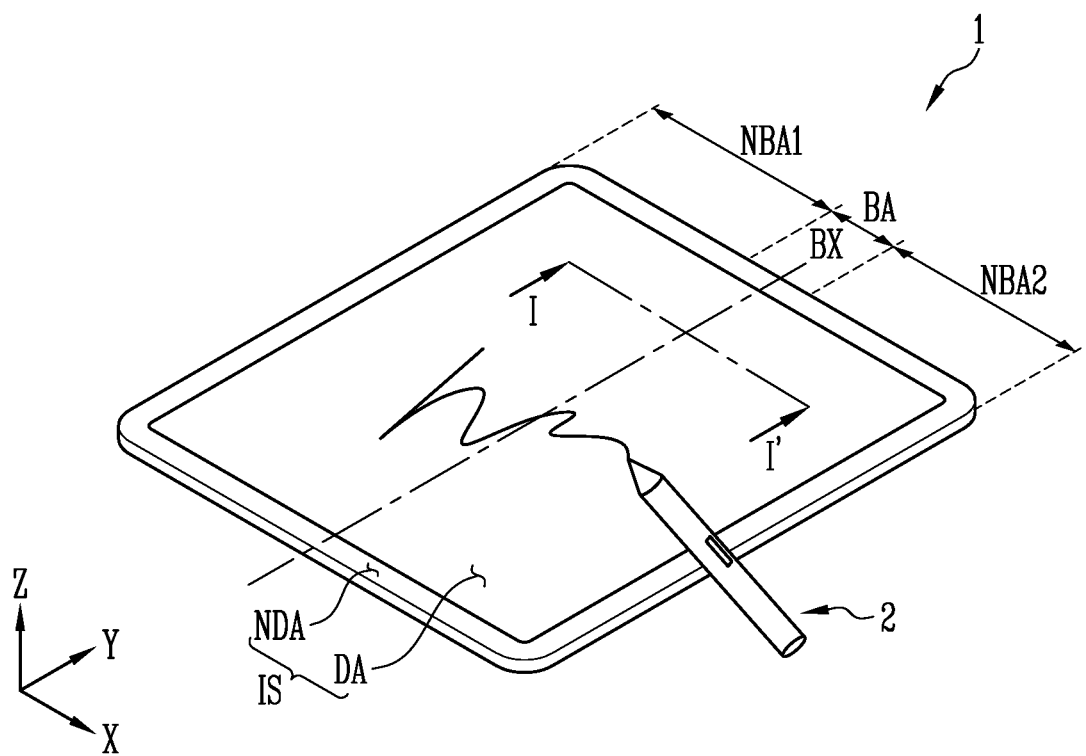
FIG. 1 illustrates a display device and an electronic pen according to an embodiment.

The advantages and features of the disclosure and the methods for accomplishing the same will be apparent from embodiments described hereinafter with reference to the accompanying drawings. However, the disclosure is not limited to embodiments disclosed below, but may be implemented in various different forms. These embodiments are provided to make the disclosure complete, and to fully inform the scope of the disclosure to those skilled in the art to which the disclosure pertains as defined by the scope of the claims.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B.

The terminology used in this specification is for describing embodiments and is not intended to limit the disclosure. In this specification, the singular form also includes the plural form unless otherwise specified.

As used herein, "comprises" and/or "comprising", "includes" and/or "including", "have" and/or "having" (and other variations) do not exclude the presence or addition of one or more other components, steps, operations and/or elements as well as the components, steps, operations and/or elements mentioned.

It will also be understood that when a layer is referred to as being "on" another layer or substrate, it may be directly on the other layer or substrate, or intervening layers may also be present. In contrast, when an element is referred to as being "directly on" another element, there are no intervening elements present. The same reference numbers indicate the same components throughout the specification. In the attached figures, the thickness of layers and regions is exaggerated for clarity.

When a component is described as being "connected", "coupled" or "connected" to another component, the component may be directly connected to or connected to the other component. However, it should be understood that other components may be "interposed" between each component, or that each component may be "connected", "coupled" or "connected" through other components.

An element or layer being referred to as the "on" that of another element or layer includes all cases in which another layer or other element is interposed above or in between or immediately above or in between. Throughout the specification, the same reference numerals denote the same elements.

Although the terms first, second, etc. are used to describe various components, it will be understood that these components are not limited by these terms. These terms are only used to distinguish one component from another component. Therefore, it will be understood that the first component mentioned below may be the second component within the technical spirit of the disclosure.

In addition, terms such as "under", "below," "lower," "above," "upper," and the like are used to describe the relationship of the configurations shown in the drawings. The terms are used as a relative concept and may be described with reference to the direction indicated in the drawings.

Further when a layer, film, region, substrate, or area, or element, is referred to as being "below" another layer, film, region, substrate, or area, or element, it may be directly below the other layer, film, region, substrate, or area, or element, or intervening layers, films, regions, substrates, or areas, or elements, may be present therebetween. Conversely, when a layer, film, region, substrate, or area, or element, is referred to as being "directly below" another layer, film, region, substrate, or area, or element, intervening layers, films, regions, substrates, or areas, or elements may be absent therebetween. Further, "over" or "on" may include positioning on or below an object and does not necessarily imply a direction based upon gravity.

The spatially relative terms "under", "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, embodiments of the disclosure will be described in detail with reference to the accompanying drawings.

Figure 2:
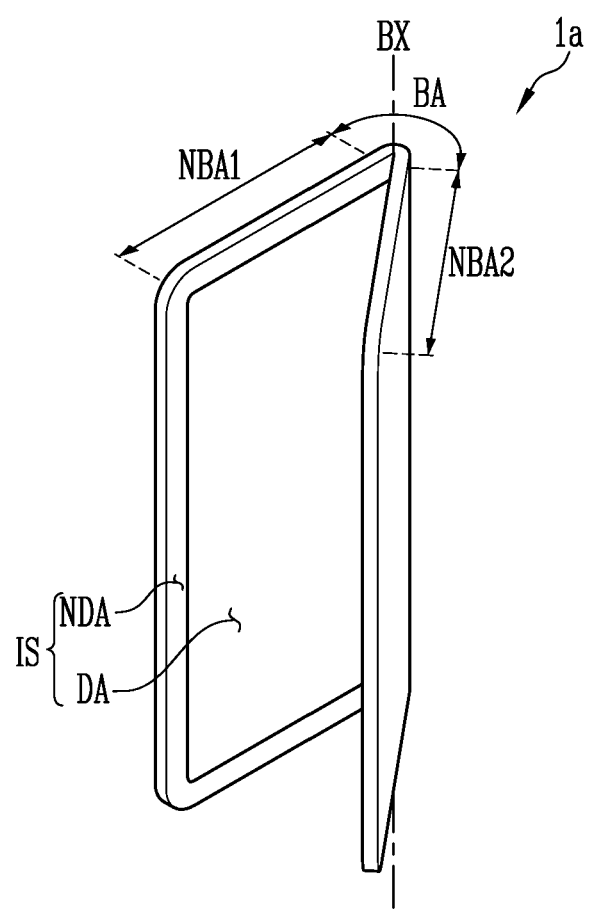
FIG. 2 and FIG. 3 illustrate a state in which the display device of FIG. 1 is folded.
Figure 3:
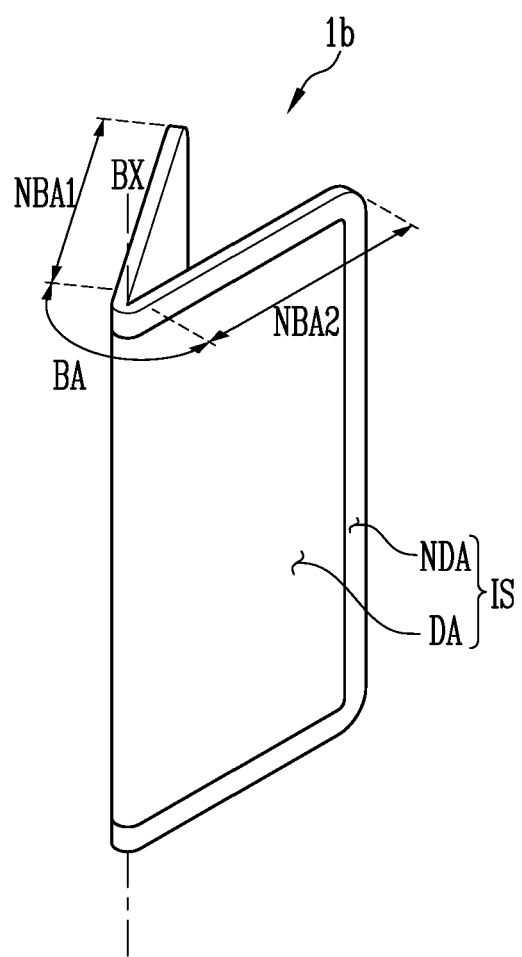

FIG. 1 illustrates a display device and an electronic pen or stylus according to an embodiment, showing a state in which the display device is unfolded. FIG. 2 and FIG. 3 illustrate a state in which the display device of FIG. 1 is folded.

The display device 1 illustrated in FIG. 1 to FIG. 3 may be, for example, a foldable display device. However, a shape of the display device 1 is not necessarily limited to that which is illustrated therein, and in a case that the display device 1 may include a portion in which a tensile force or a compressive force is generated by bending (or folding), the shape or shapes of the display device 1 resulting from such a tensile force or a compressive force is/are within the spirit of the disclosure. For example, the disclosure may be applied to a display device and a rollable display device, which may be simply bent.

Hereinafter, an organic light emitting diode (OLED) display device as a display device will be described as an example. However, the disclosure is not limited thereto, and may also be applied to other display devices such as a liquid crystal display, a field emission display, an electrophoretic display, a quantum dot light emitting display, or a micro LED display, within the spirit and the scope of the disclosure.

Referring to FIG. 1, the display device 1 may include areas defined depending on an operation type. By way of example, the display device 1 may include a bendable area BA that may be bendable based on a bendable axis BX, and one or more non-bendable areas NBA1 and NBA2 that may not be bendable. FIG. 1 illustrates a case in which one or a bendable area BA and two non-bendable areas NBA1 and NBA2 are included, but the disclosure is not limited thereto. For example, the display device 1 may include two or more bendable areas, or three or more non-bendable areas.

The non-bendable areas NBA1 and NBA2 may include a first non-bendable area NBA1 and a second non-bendable area NBA2 which may be spaced apart from each other with the bendable area BA positioned therebetween. By way of example, the display device 1 may include a bendable area BA that may be bendable based on a bending axis BX, and one or more non-bendable areas NBA1 and NBA2 that may not be bendable. The first non-bendable area NBA1 may be connected to a first side of the bendable area BA, and the second non-bendable area NBA2 may be connected to a second side of the bendable area BA.

The display device 1 may include a display surface IS. The display surface IS may be parallel to a plane that may be defined by a first direction (X-axis direction) and a second direction (Y-axis direction). A direction in which an image may be displayed from the display surface IS may be defined as a normal direction of the display surface IS. The display direction may be the same as a third direction (Z-axis direction).

The display surface IS may include areas. The display surface IS may include a display area DA where an image may be displayed and a non-display area NDA adjacent to the display area DA.

The display area DA may be defined by each light emitting element, and may include light emitting areas (not illustrated). As an example, the display area DA may be used as a detection member for detecting an external environment.

The non-display area NDA may be an area in which an image may not be displayed, and may be positioned to surround or be adjacent to the display area DA in a plan view. However, the disclosure is not limited thereto, and shapes of the display area DA and the non-display area NDA may vary and may be relatively designed. As an example, although not separately illustrated, a speaker, a camera, a sensor, and the like may be disposed in the non-display area NDA.

The display device 1 may be bent. The display device 1 may be a foldable display device that may be folded. In an embodiment, the display device 1 may be in-folded or out-folded.

The bending axis BX to which the display device 1 may be bent may be set in the second direction (Y-axis direction), but the disclosure is not limited thereto. In a case that the display device 1 is bent (folding state), a radius of curvature may be about 1 mm or more and about 5 mm or less.

A display device 1a is illustrated in FIG. 2 to be in-folded such that the display surface IS may face inwards. In a case that the display device 1a is in-folded, the bending axis BX may be formed on the display surface IS.

A display device 1b is illustrated in FIG. 3 to be out-folded such that the display surface IS faces outwards. In a case that the display device 1b is out-folded, the bending axis BX may be formed under (or at a lower portion of) the display surface IS.

The display device 1 may be in-folded or out-folded in one or a bendable area BA, but embodiments are not limited thereto. Hereinafter, the display device 1 will be described based on being in-folded in the bendable area BA, and a coupling or connecting relationship for each element provided in the display device 1 in a state where the display device 1 is unfolded will be described.

The display device 1 may recognize the electronic pen 2. The electronic pen 2 may be one or an input means of the display device 1. The electronic pen 2 may provide input information to the sensing layer (DT in FIG. 4) included in the display device 1 by approaching the display device 1 within a predetermined distance or touching a surface of the display device 1. Herein, the input information may include information related to a position of the electronic pen 2 with respect to the display device 1, touch intensity of the electronic pen 2 (surface pressure of the display device 1), and the like within the spirit and the scope of the disclosure. For example, the sensing layer DT may include a function of a digitizer. According to an embodiment, the electronic pen 2 may be a stylus pen. A detailed description of the sensing layer DT will be described later with reference to FIG. 4 to FIG. 8.

The electronic pen 2 may be driven by various methods such as an electromagnetic resonance (EMR) method, and an active electrostatic solution (AES) method.

The electromagnetic resonance method may include a method in which the electronic pen 2 may generate electromagnetic resonance by a magnetic field generated by the display device 1 so that signals such as coordinates of the electronic pen 2 may be provided to the display device 1. By way of example, in a case that the sensing layer DT or the like included in the display device 1 may generate a magnetic field, electromagnetic resonance may be generated in the electronic pen 2 that may be within a magnetic field range, and thus energy may be supplied to the electronic pen 2. The electronic pen 2 supplied with energy may output a wireless signal through an internal circuit. In this case, the sensing layer DT may receive a signal outputted from the electronic pen 2 at various points, may measure intensity, and may calculate a closest point to the electron pen 2 based on the intensity to determine a position of the electronic pen 2.

The active static electricity method may include a method in which static electricity may be generated in the electronic pen 2 and the sensing layer DT may recognize the static electricity to sense coordinates, pressure, and the like of the electronic pen 2.

Figure 4:
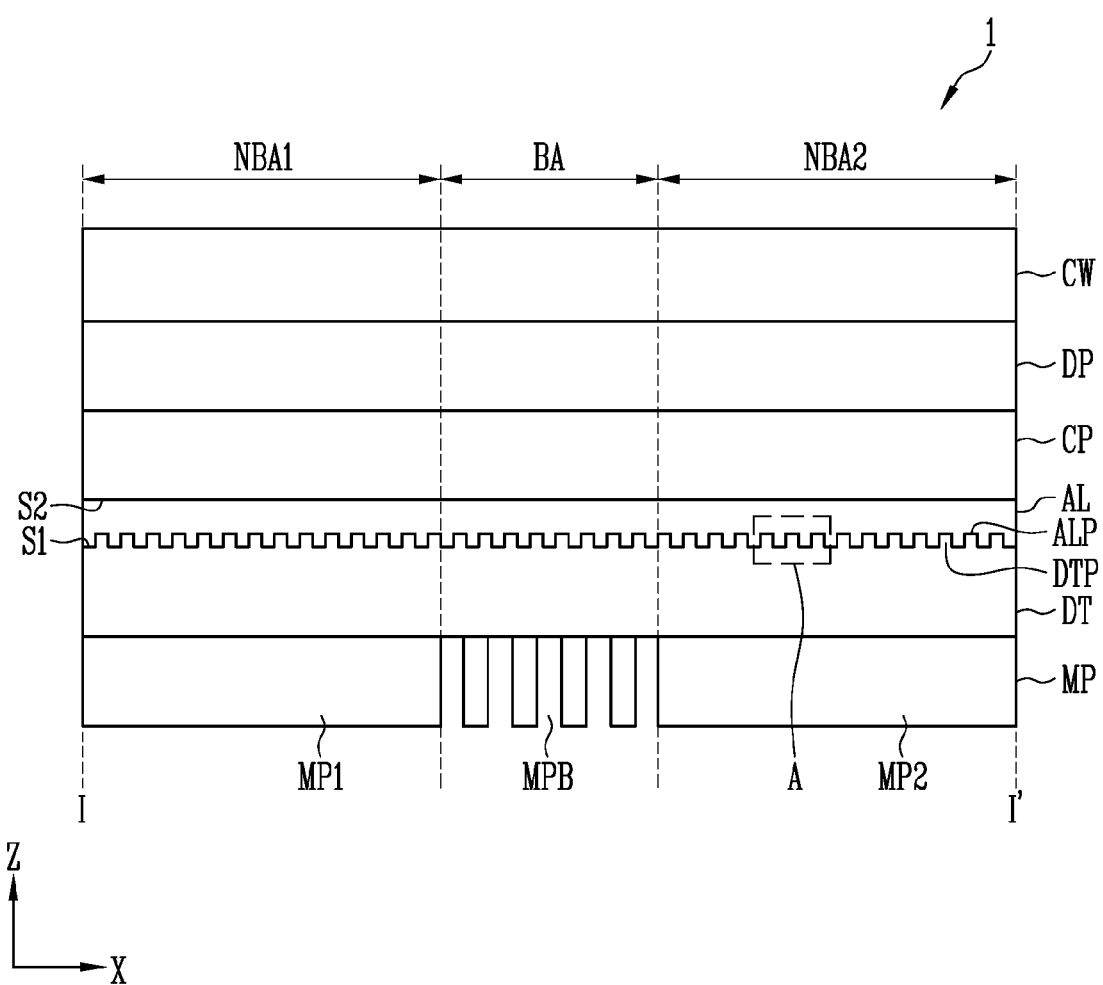
FIG. 4 illustrates a schematic cross-sectional view taken based on a line I-I' of FIG. 1.
Figure 5:
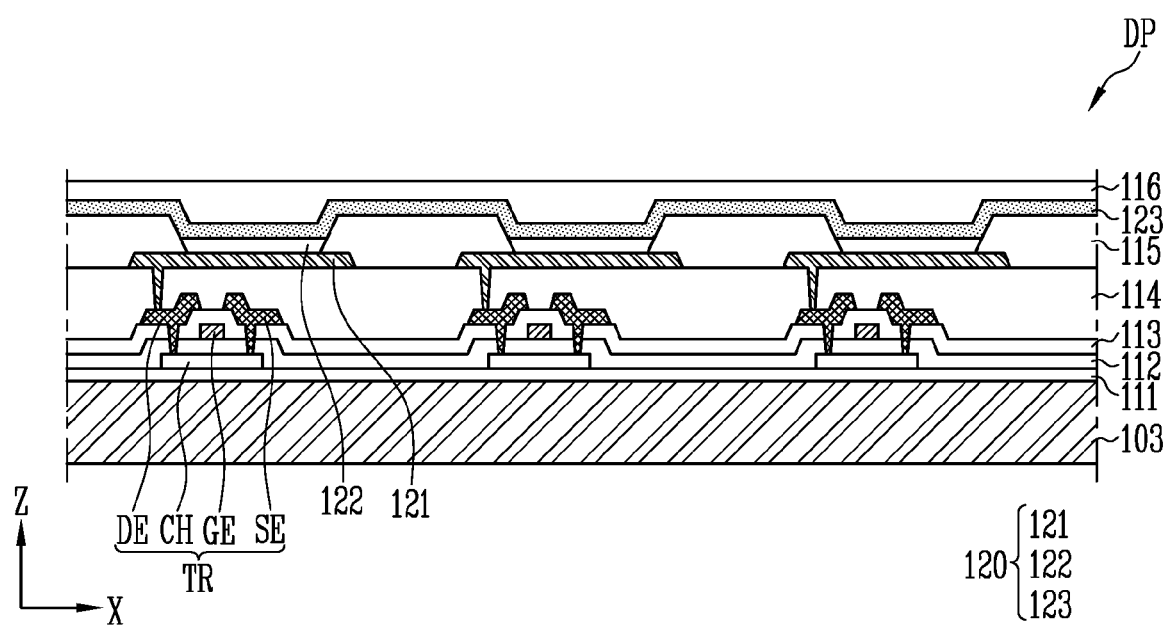
FIG. 5 illustrates a schematic cross-sectional view showing a display substrate of FIG. 4.
Figure 6:
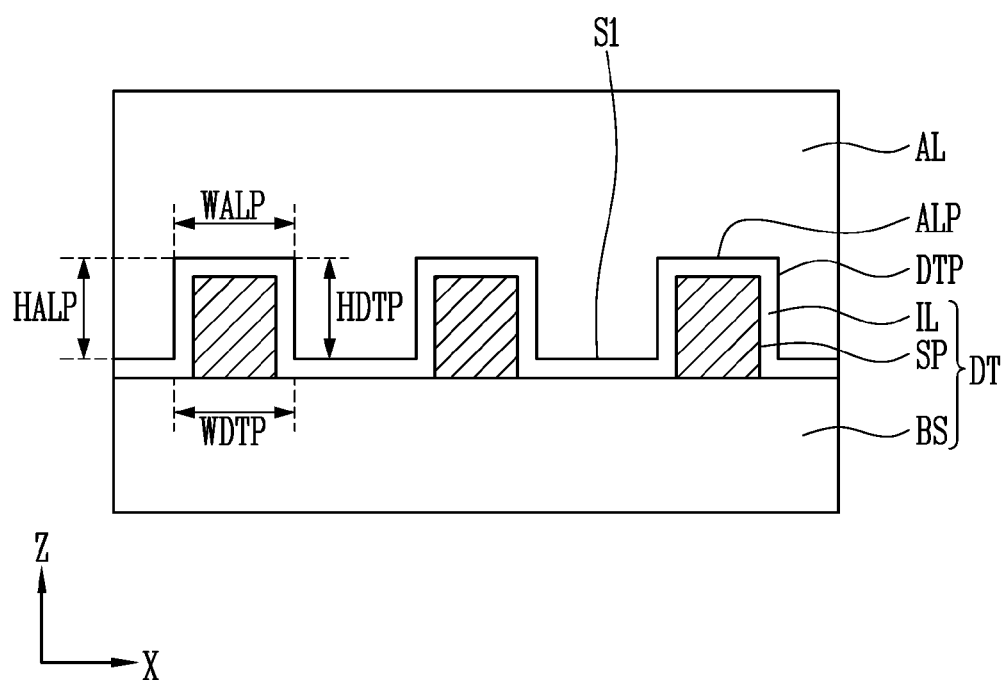
FIG. 6 illustrates an enlarged view of a portion "A" of FIG. 4.

FIG. 4 illustrates a schematic cross-sectional view taken based on a line I-I' of FIG. 1. FIG. 5 illustrates a schematic cross-sectional view showing a display substrate of FIG. 4. FIG. 6 illustrates an enlarged view of a portion "A" of FIG. 4.

A detailed description of the sensing layer DT will be described later with reference to FIG. 4 to FIG. 8. In this specification, as shown in the drawings, each element may be described as being stacked in order along one or a direction, but a position of each element may be partially changed, or another element may be disposed between the respective elements, within the spirit and the scope of the disclosure.

First, the display substrate DP will be described with reference to FIGS. 4 and 5.

The display substrate DP may include transistors TR and a light emitting element 120. The display substrate DP may include a substrate 103 that may be disposed at a lower portion thereof.

The substrate 103 may be a flexible substrate. For example, the substrate 103 may be one of a plastic substrate and a film substrate including a polymer organic material. For example, the substrate 103 may include one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and celluloseacetate propionate.

A buffer layer 111 may be disposed on the substrate 103. The buffer layer 111 may function to smooth a surface of the substrate 103 and to prevent penetration of moisture or external air. The buffer layer 111 may be an inorganic layer. The buffer layer 111 may be a single layer or a multilayer.

Transistors TR may be disposed on the buffer layer 111. The transistors TR of FIG. 5 may be driving transistors. One or more transistors TR may be provided for each pixel. Each of the transistors TR may include a semiconductor layer CH, a gate electrode GE, a source electrode SE, and a drain electrode DE.

The semiconductor layer CH may be disposed on the buffer layer 111. The semiconductor layer CH may include amorphous silicon, polysilicon, or an organic semiconductor. In an embodiment, the semiconductor layer CH may be an oxide semiconductor. Although not separately illustrated, the semiconductor layer CH may include a channel region, a source region and a drain region respectively positioned at opposite sides of the channel region and doped with an impurity.

A gate insulating layer 112 may be disposed on the semiconductor layer CH. The gate insulating layer 112 may be an inorganic layer. The gate insulating layer 112 may be a single layer or a multilayer.

A gate electrode GE may be disposed on the gate insulating layer 112. The gate electrode GE may be formed of a metallic material having conductivity. For example, the gate electrode GE may include at least one of molybdenum (Mo), aluminum (Al), copper (Cu), and titanium (Ti). The gate electrode GE may be a single layer or a multilayer.

An interlayer insulating layer 113 may be disposed on the gate electrode GE. The interlayer insulating layer 113 may be an inorganic layer. The interlayer insulating layer 113 may be a single layer or a multilayer.

A source electrode SE and a drain electrode DE may be disposed on the interlayer insulating layer 113. The source electrode SE and drain electrode DE may be formed of a metallic material having conductivity. For example, the source electrode SE and the drain electrode DE may include at least one of aluminum (Al), copper (Cu), titanium (Ti), and molybdenum (Mo). The source electrode SE and the drain electrode DE may be electrically connected to the source region and the drain region of the semiconductor layer CH through contact holes penetrating the interlayer insulating layer 113 and gate insulating layer 112, respectively. Although not separately illustrated, the display substrate DP may include a storage capacitor and a switching transistor disposed on the substrate 103.

A protective layer 114 may be disposed on the source electrode SE, the drain electrode DE, and the interlayer insulating layer 113. Herein, the protective layer 114 may be disposed to cover or overlap the pixel circuit portion including the transistor TR. The protective layer 114 may be a passivation film and/or a planarization film. The passivation film may include an inorganic insulating material such as $SiO_2$ and $SiN_x$, and the planarization film may include an organic insulating material such as acrylic and polyimide. In a case that the protective layer 114 may include both a passivation film and a planarization film, the passivation film may be first disposed on the interlayer insulating film 113, and then, the planarization film may be disposed on the passivation film.

First electrodes 121 may be disposed on the protective layer 114. The first electrodes 121 may be a pixel electrode disposed for each of the pixels. As an example, the first electrodes 121 may be an anode electrode of the organic light emitting diode. The first electrodes 121 may be electrically connected to the drain electrode DE (or the source electrode SE) of the transistor TR through a contact hole penetrating the protective layer 114. The first electrodes 121 may be made of a material having a high work function. The first electrodes 121 may include an indium-tin-oxide (ITO), an indium-zinc-oxide (IZO), a zinc oxide (ZnO), an indium oxide ($In_2O_3$), and the like within the spirit and the scope of the disclosure. The conductive materials exemplified above have relatively large work functions and a transparent property.

In a case that the display substrate DP is a front emission type, a material such as silver (Ag), magnesium (Mg), aluminum (Al), platinum (Pt), lead (Pd), gold (Au), nickel (Ni), neodium (Nd), iridium (Ir), Chromium (Cr), lithium (Li), calcium (Ca), or a mixture thereof may be included as an example to the exemplified conductive materials. Accordingly, the first electrodes 121 may have a single layer structure made of the above-described conductive materials and a reflective material, or may have a multi-layer structure in which they may be stacked.

A pixel defining layer 115 may be disposed on the first electrodes 121. The pixel defining layer 115 may include an opening exposing at least a portion of the first electrodes 121. The pixel defining layer 115 may include an organic material or an inorganic material. In an embodiment, the pixel defining layer 115 may include at least one material of a photoresist, a polyimide resin, an acrylic resin, a silicone compound, and a polyacrylic resin.

An emission layer 122 may be disposed on the first electrodes 121 exposed by the pixel defining layer 115.

A second electrode 123 may be disposed on the emission layer 122. The second electrode 123 may be a common electrode disposed over an entire surface of the substrate 103. As an example, the second electrode 123 may be a cathode electrode of the organic light emitting diode.

The second electrode 123 may be made of a material having a low work function. The second electrode 123 may include Li, Ca, LiF/Ca, LiF/Al, Al, Mg, Ag, Pt, Pd, Ni, Au, Nd, Ir, Cr, BaF, Ba or a compound thereof or a mixture thereof (for example, a mixture of Ag and Mg, and other such mixtures within the spirit and the scope of the disclosure).

In a case that the display substrate DP is a front emission type, a conductive layer having a small work function as the second electrode 123 may be formed as a thin film, and a transparent conductive film, for example, an indium-tin-oxide (ITO) layer, an indium-zinc-oxide (IZO) layer, a zinc-oxide (ZnO) layer, an indium-oxide ($In_2O_3$) layer, or the like may be stacked on the conductive layer.

The first electrodes 121, the emission layer 122 and the second electrode 123 described above may constitute the light emitting element 120 as an organic light emitting diode. Although not separately illustrated, a hole injection layer and/or a hole transport layer may be disposed between the first electrodes 121 and the emission layer 122, and an electron transport layer and/or an electron injection layer may be disposed between the emission layer 122 and the second electrode 123.

An encapsulation layer 116 may be disposed on the second electrode 123. The encapsulation layer 116 may include inorganic films. Although not separately illustrated, the encapsulation layer 116 may be formed of a multilayer film including a first inorganic film, an organic film, and a second inorganic film which may be sequentially stacked. Herein, the first inorganic film and the second inorganic film may include at least one of silicon oxide ($SiO_x$), silicon nitride ($SiN_x$), and silicon oxynitride ($SiON_x$), and the organic film may include at least one of epoxy, acrylate, and urethane acrylate.

The window CW may be disposed on the display substrate DP. The window CW may cover or overlap and protect the display substrate DP. The window CW may include a soft material and a transparent material. For example, the window CW may include plastic, and in this case, the window CW may have a flexible characteristic.

Examples of the plastic or plastics applicable to the window CW may include polyimide, polymethylmethacrylate (PMMA), polycarbonate (PC), polyethylenenaphthalate (PEN), polyvinylidene chloride, polyvinylidene difluoride (PVDF), polystyrene, ethylene vinylalcohol copolymer, polyethersulphone (PES), polyetherimide (PEI), polyphenylene Sulfide (polyphenylene sulfide, PPS), polyallylate, triacetyl cellulose (TAC), cellulose acetate propionate (CAP), and other such materials within the spirit and the scope of the disclosure, and the like, but the disclosure is not limited thereto.

The window CW may be attached to an upper surface of the display substrate DP through an adhesive member. The adhesive member may be a transparent adhesive film such as an optically clear adhesive (OCA), a transparent adhesive resin such as an optically clear resin (OCR), or a pressure sensitive adhesive (PSA), but the disclosure is not limited thereto.

Although not separately illustrated, a polarizing member may be disposed between the display substrate DP and the window CW. The polarizing member may transfer light parallel to a polarization axis among light emitted from the light emitting element 120. The polarizing member may be a coating polarization layer or a polarization layer formed by deposition. As an example, the polarizing member may be formed by coating a material containing dichroic dye and a liquid crystal compound. As an example, the polarizing member may serve to prevent external light reflection. According to an embodiment, the polarizing member may be omitted. In this case, the polarizing member may be replaced with a light absorbing layer such as a color filter and/or a wavelength conversion layer such as a quantum dot film.

The sensing layer DT may be disposed under the display substrate DP. The sensing layer DT may include a digitizer that may recognize the above-described electronic pen (2 in FIG. 1). The sensing layer DT may include sensing patterns DTP for receiving an input from the electronic pen 2 based on electromagnetic induction. The sensing pattern DTP may be formed by patterning a conductor on a flexible printed circuit board (FPCB) or by being printed on the flexible printed circuit board (FPCB) with conductive ink. The sensing pattern DTP may have a shape protruding in the third direction (Z-axis direction). For example, the sensing pattern DTP may protrude toward an adhesive layer AL, which will be described later. The sensing pattern DTP may be formed by the sensing electrode (SP of FIG. 6) of the sensing layer DT, and in a case that bubbles may be generated or a pattern may be recognized in the manufacturing process, display quality may be deteriorated. Accordingly, the display device 1 according to an embodiment may form a groove pattern ALP having a shape that may be complementary to that of the sensing pattern DTP on the adhesive layer AL coupled or connected or attached to the sensing layer DT to improve an adhesive force between the sensing layer DT and the adhesive layer AL, thereby minimizing bubble generation and pattern visibility caused by the sensing pattern DTP. A detailed description thereof will be described later with reference to FIG. 6.

The adhesive layer AL may be disposed between the display substrate DP and the sensing layer DT.

The adhesive layer AL may include a first surface S1 facing the sensing layer DT and a second surface S2 facing the display substrate DP. The adhesive layer AL may include groove patterns ALP that may be recessed from the first surface S1. The groove patterns ALP may have a shape that may be recessed in the third direction (Z-axis direction) from the first surface S1.

Each of the groove patterns ALP may be formed or disposed to overlap the sensing pattern DTP of the above-described sensing layer DT in the third direction (Z-axis direction). As an example, the groove pattern ALP may have a shape that may be complementary to the sensing pattern DTP. Accordingly, the adhesive force may be improved in a process in which the adhesive layer AL may be coupled or connected or attached to the sensing layer DT, thereby minimizing bubble generation and pattern visibility caused by the sensing pattern DTP. FIG. 6 is referred to for a detailed description.

Referring to FIG. 6, a thickness HDTP in the third direction (Z-axis direction) of the sensing pattern DTP may be substantially the same as a thickness HALP in the third direction (Z-axis direction) of the groove pattern ALP. As an example, a width WDTP in the first direction (X-axis direction) of the sensing pattern DTP may be substantially the same as a width WALP in the first direction (X-axis direction) of the groove patterns ALP. In a process of coupling or connecting or adhering the sensing layer DT and the adhesive layer AL, the sensing pattern DTP of the sensing layer DT may directly contact one or a surface of the groove pattern ALP of the adhesive layer AL. In this case, the sensing pattern DTP of the sensing layer DT and the groove pattern ALP of the adhesive layer AL may be complementarily coupled or connected or attached to improve an interlayer adhesive force. Accordingly, even in a case that the sensing layer DT may include a predetermined sensing pattern DTP, air bubbles generated by the sensing pattern DTP and pattern visibility may be minimized, thereby improving display quality.

Meanwhile, in the drawing, the case where the sensing pattern DTP and/or the groove pattern ALP may have a substantially rectangular cross-sectional shape is illustrated, but the disclosure is not limited thereto. For example, the sensing pattern DTP and/or the groove pattern ALP may have a substantially (inverse) trapezoidal shape, a substantially triangular shape, or a substantially narrow hemispherical cross-sectional shape.

In an embodiment, the sensing layer DT may include a base layer BS, a sensing electrode SP, and a sensing insulating layer IL. The base layer BS, the sensing electrode SP, and the sensing insulating layer IL of the sensing layer DT may constitute a digitizer.

The base layer BS may be made of a flexible film substrate, and may be made of a film having excellent mechanical strength and thermal stability. For example, the base layer BS may be a film including a thermoplastic resin, for example, a polyester-based resin such as polyethylene terephthalate, polyethylene isophthalate, polyethylene naphthalate, and polybutylene terephthalate, a cellulose-based resin such as diacetyl cellulose and triacetyl cellulose, a polycarbonate-based resin, an acrylic resin such as polymethyl (meth)acrylate and polyethyl (meth)acrylate, a styrene resin such as polystyrene and acrylonitrile-styrene copolymers, a polyolefin resin such as polyethylene, polypropylene, polyolefins having a cyclo- or norbornene structure, and an ethylene-propylene copolymer, a vinyl chloride resin, an amide resin such as nylon and aromatic polyamide, an imide resin, a polyether sulfone resin, a sulfone resin, a polyether ether ketone resin, a sulfide polyphenylene resin, a vinyl alcohol resin, a vinylidene chloride resin, a vinyl butyral resin, an allylate resin, a polyoxymethylene resin, an epoxy resin, or the like, but the disclosure is not limited thereto. For example, the base layer BS may be made of a film including a thermosetting resin such as a (meta) acrylic, urethane, acrylic urethane, epoxy, or silicone-based resin or a UV curable resin.

The sensing electrode SP may be disposed on the base layer BS. The sensing electrode SP may be disposed between the base layer BS and the adhesive layer AL. The sensing electrode SP may be disposed to overlap the groove patterns ALP of the adhesive layer AL.

The sensing electrode SP may include a conductive material, and by way of example, the sensing electrode SP may be made of a metal material. The metal material may include gold (Au), silver (Ag), copper (Cu), molybdenum (Mo), nickel (Ni), chromium (Cr), silver-palladium-copper alloy (APC), or the like, but the disclosure is not limited thereto.

The sensing electrode SP may be formed by deposition, as an example, sputtering. According to the sputtering method, the sensing electrode SP may be formed with a thinner thickness compared to a product using a metal foil that may be currently commercialized.

According to an embodiment, the sensing electrode SP may be formed to include conductive layers. In this case, a first sensing electrode made of a first conductive layer may be disposed on the base layer BS, a second sensing electrode made of a second conductive layer may be disposed on the first sensing electrode, and the first sensing electrode and the second sensing electrode may be insulated by an insulating layer interposed therebetween. In this case, the first sensing electrode may be used as a sensing electrode of a transmitter, and the second sensing electrode may be used as a sensing electrode of a receiver, but the disclosure is not limited thereto.

The sensing insulating layer IL may be disposed on the sensing electrode SP. The sensing insulating layer IL may cover or overlap the sensing electrode SP, and may be disposed on a front surface of the base layer BS. The sensing insulating layer IL may include an organic insulating material and/or an inorganic insulating material.

Referring to FIG. 4 again, a cover panel CP may be disposed between the sensing layer DT and the display substrate DP. The cover panel CP may be coupled or connected or attached to the sensing layer DT through the adhesive layer AL. One or a surface of the cover panel CP may contact the second surface S2 of the adhesive layer AL.

The cover panel CP may include a film unit and/or a cushion unit. The film unit may be a protective film. The film unit may be disposed to cover or overlap an entire lower surface of the display substrate DP. The film unit may include at least one of polyethylene terephthalate (PET), polyethylene naphthalate (PEN), polyimide (PI), and polyethylene sulfide (PES), but the disclosure is not necessarily limited thereto. The cushion unit may be formed of various materials having a cushion. For example, the cushion unit may be formed to have a form of latex, sponge, urethane foam that may be an expandable resin, ethylene-vinyl acetate (EVA), silicone, and/or a tape having a cushion, but the disclosure is not limited thereto. In a case that the cover panel CP may include both the film unit and the cushion unit, the film unit may first be disposed under the display substrate DP, and the cushion unit may be disposed under the film unit.

A metal plate MP may be disposed under the sensing layer DT. The metal plate MP may serve to shield electromagnetic waves. By way of example, the metal plate MP may minimize an influence of electrical or magnetic noise generated under (or at a lower portion of) the metal plate MP on the sensing layer DT and the display substrate DP disposed on the metal plate MP. As an example, the metal plate MP may perform at least one function of a ground function, a buffer function, a strength reinforcement function, a support function, an adhesion function, and a pressure sensing function. The metal plate MP may be a soft magnetic material, and may be a thin metal sheet having an amorphous structure or a nanocrystalline structure, but the disclosure is not limited thereto.

The metal plate MP may include a first metal plate MP1 and a second metal plate MP2 which may be spaced apart from each other. The first metal plate MP1 and the second metal plate MP2 may be spaced apart from each other with the above-described bendable area BA interposed therebetween. The first metal plate MP1 may overlap the first non-bendable region NBA1, and the second metal plate MP2 may overlap the second non-bendable region NBA2. The metal plate MP may include bendable grooves MPB positioned or disposed between the first and second metal plates MP1 and MP2. The bendable grooves MPB may be disposed to overlap the bendable area BA. The bendable groove MPB may be a portion of the metal plate MP that may be partially removed from the bendable area BA. As the metal plate MP may include the bendable groove MPB, a folding characteristic of the display device 1 may be improved.

In accordance with the display device 1 according to the above-described embodiment, an interlayer adhesive force between the sensing layer DT and the adhesive layer AL may be improved as the adhesive layer AL coupled or connected or attached to the sensing layer DT may include the groove pattern ALP having the shape that may be complementary to the sensing pattern DTP of the sensing layer DT Accordingly, bubble generation and pattern visibility due to the sensing pattern DTP of the sensing layer DT may be minimized, thereby improving the display quality.

Hereinafter, a display device according to an embodiment disclosure will be described. In the following embodiment, the same components as those already described are referred to by the same reference numerals, and duplicate descriptions may be omitted or simplified.

Figure 7:
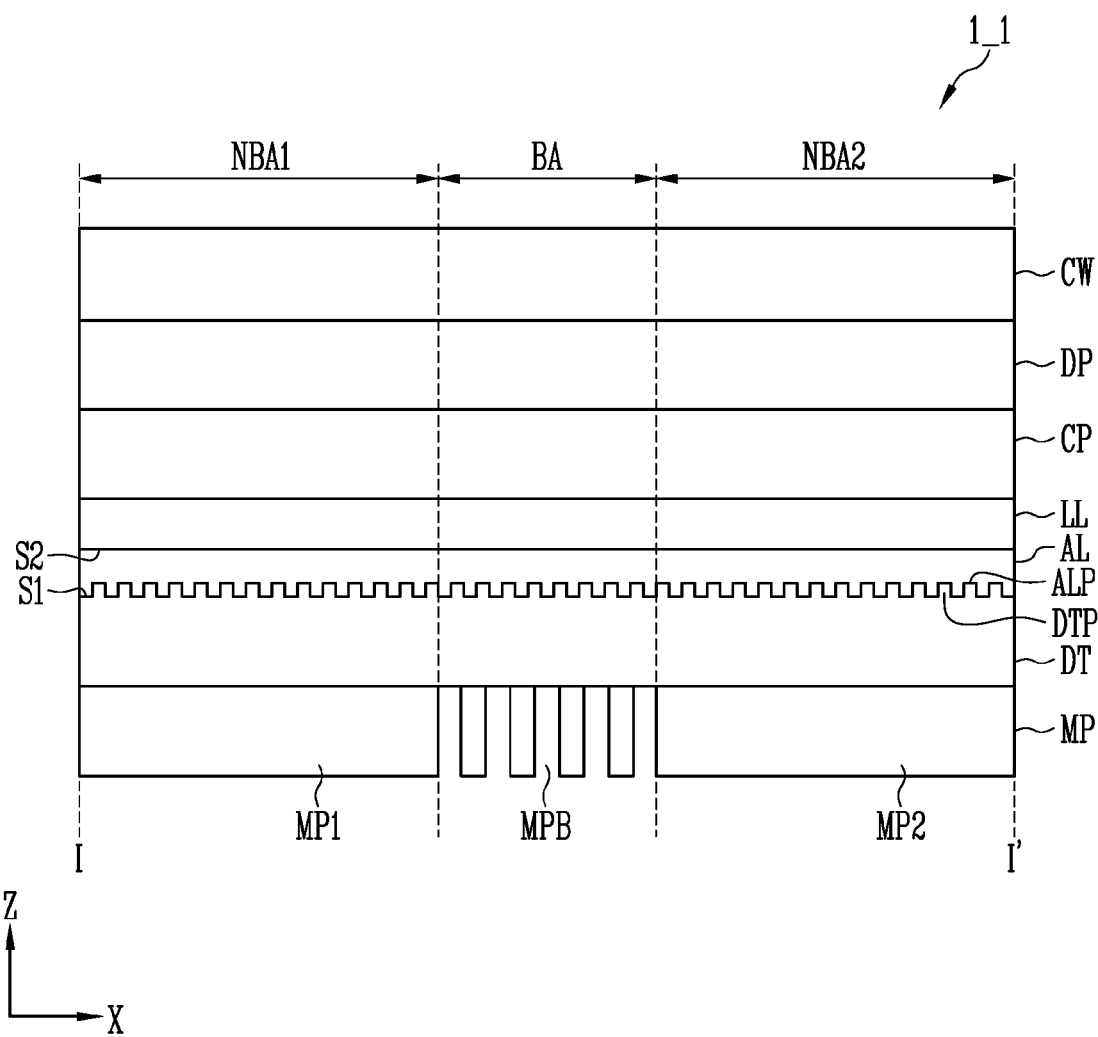
FIG. 7 illustrates a schematic cross-sectional view of a display device according to an embodiment.

FIG. 7 illustrates a schematic cross-sectional view of a display device according to an embodiment.

Referring to FIG. 7, the display device 1_1 according to an embodiment may be different from an embodiment of FIG. 1 to FIG. 6 in that it may include a low reflection layer LL disposed on the sensing layer DT.

By way of example, the low reflection layer LL may be disposed between the sensing layer DT and the display substrate DP. As an example, the low reflection layer LL may be disposed between the adhesive layer AL and the display substrate DP. The low reflection layer LL may be directly disposed on the adhesive layer AL, and may directly contact the second surface S2 of the adhesive layer AL. The low reflection layer LL may include at least one of metal, plastic, and glass. By way of example, the low reflection layer LL may include at least one of opaque metal mesh, carbon fiber reinforced plastics (CFRP), glass fiber reinforced plastics (GFRP), and graphite fiber reinforced plastics (GFRP), but the disclosure is not necessarily limited thereto.

A cover panel CP may be disposed between the display substrate DP and the low reflection layer LL. In this case, a first surface of the low reflection layer LL may contact the second surface S2 of the adhesive layer AL, and a second surface of the low reflection layer LL may contact the cover panel CP. The low reflection layer LL may be attached to a first surface of the cover panel CP through an adhesive member. The adhesive member may be a pressure sensitive adhesive PSA, but the disclosure is not limited thereto.

As described above, in a case that the low reflection layer LL may be disposed on the sensing layer DT, the phenomenon in which the sensing pattern DTP of the sensing layer DT may be recognized may be minimized, thereby improving display quality. Since the cover panel CP has been described with reference to FIG. 4, overlapping contents may be omitted.

Figure 8:
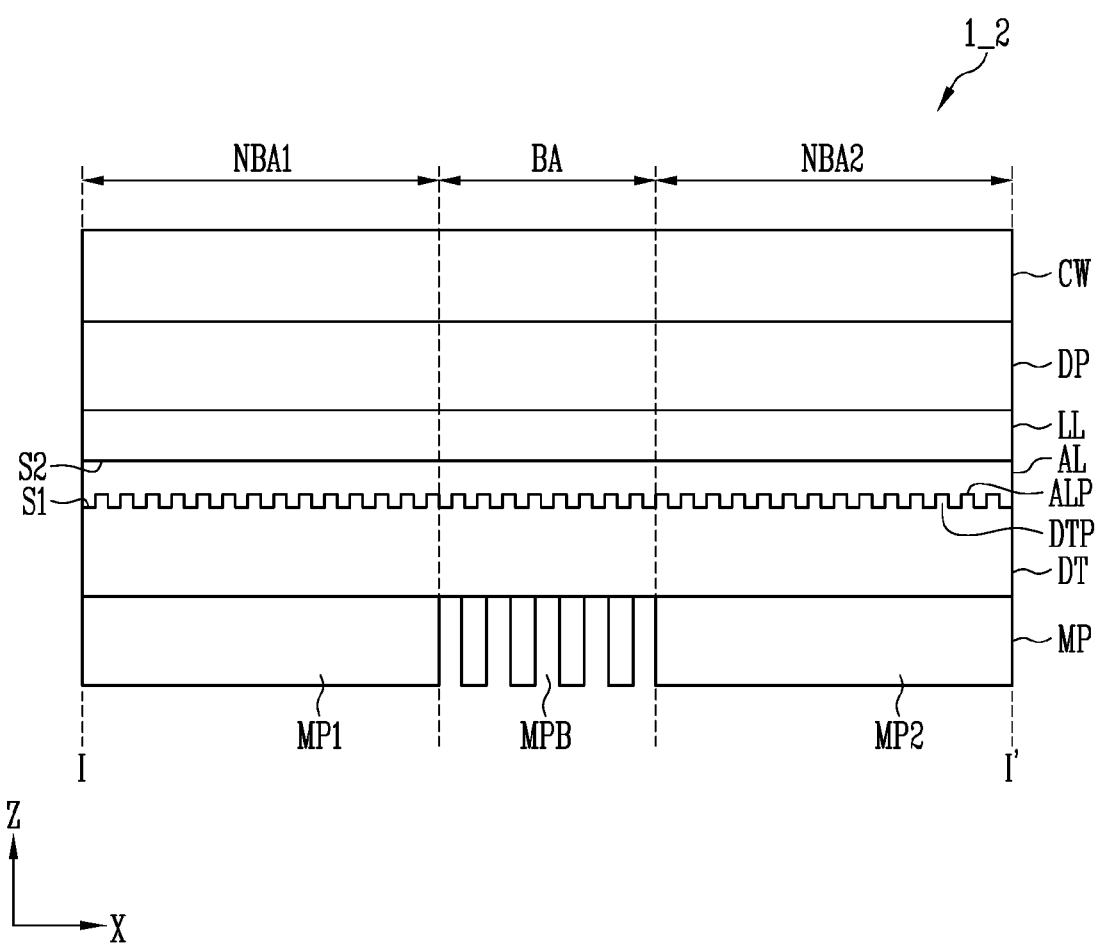
FIG. 8 illustrates a schematic cross-sectional view of a display device according to an embodiment.

FIG. 8 illustrates a schematic cross-sectional view of a display device according to an embodiment.

Referring to FIG. 8, the display device 1_2 according to an embodiment may be different from an embodiments of FIG. 1 to FIG. 6 in that the low reflection layer LL may be disposed under the display substrate DP and the cover panel may be omitted.

By way of example, a cover panel disposed under the display substrate DP may be omitted because it may be replaced with the low reflection layer LL. In this case, the low reflection layer LL may be disposed directly under the display substrate DP. The first surface of the low reflection layer LL may contact the second surface S2 of the adhesive layer AL, and the second surface of the low reflection layer LL may contact a lower surface of the display substrate DP. The low reflection layer LL may be attached under (or to the lower portion) of the display substrate DP through an adhesive member. The adhesive member may be a pressure sensitive adhesive PSA, but the disclosure is not limited thereto.

As described above, in a case that the cover panel may be replaced with the low reflection layer LL to be omitted, a repelling force of the display device 1 may be minimized, thereby improving the folding characteristic. Since the low reflection layer LL has been described with reference to FIG. 7, redundant descriptions may be omitted.

One of ordinary skill in the art will appreciate that the disclosure may be implemented without departing from the characteristics of the above-described description in a modified form. Therefore, the disclosed descriptions and methods should be considered in an explanatory sense rather than a restrictive sense. The scope of the disclosure, not by the forgoing description given in the appended claims, and all differences within the equivalent scope will be construed as being included in the disclosure.

What is claimed is:

1. A display device comprising:
    a bendable area and non-bendable areas adjacent to the bendable area;
    a display substrate including transistors and a light emitting element;
    a sensing layer disposed under the display substrate and including a digitizer; and
    an adhesive layer disposed between the display substrate and the sensing layer,
    wherein the adhesive layer includes:
        a first surface facing the sensing layer; and
        groove patterns recessed from the first surface of the adhesive layer, and
    wherein the sensing layer includes:
        base layer;
        a sensing electrode disposed on the base layer; and
        an insulating layer disposed between the sensing electrode and the adhesive layer.

2. The display device of claim 1, wherein the sensing layer includes sensing patterns protruding toward the adhesive layer.

3. The display device of claim 2, wherein the sensing patterns overlap the groove patterns.

4. The display device of claim 2, wherein the sensing patterns directly contact the groove patterns.

5. The display device of claim 4, wherein a thickness of the sensing patterns in a first direction is substantially same as a thickness of the groove patterns in the first direction.

6. The display device of claim 5, wherein a width of the sensing patterns in a second direction intersecting the first direction is substantially same as a width of the groove patterns in the second direction that intersects the first direction.

7. The display device of claim 1, wherein the sensing electrode overlaps the groove patterns.

8. The display device of claim 1, wherein the sensing layer senses an input of an electronic pen.

9. The display device of claim 1, further comprising:
a low reflection layer disposed between the display substrate and the adhesive layer.

10. The display device of claim 9, wherein the low reflection layer includes at least one of metal, plastic, and glass.

11. The display device of claim 10, wherein the plastic is a fiber reinforced plastic.

12. The display device of claim 9, wherein a first surface of the low reflection layer contacts a second surface of the adhesive layer.

13. The display device of claim 12, further comprising:
a cover panel disposed between the low reflection layer and the display substrate.

14. The display device of claim 12, wherein a second surface of the low reflection layer contacts the display substrate.

15. The display device of claim 1, further comprising:
a metal plate disposed under the sensing layer.

16. The display device of claim 15, wherein the metal plate includes bendable grooves overlapping the bendable area of the display device.

17. The display device of claim 15, wherein
the non-bendable areas of the display device include a first non-bendable area and a second non-bendable area, and
the bendable area is disposed between the first non-bendable area and the second non-bendable area.

18. The display device of claim 17, wherein the metal plate includes:
a first metal plate overlapping the first non-bendable area; and
a second metal plate overlapping the second non-bendable area.

19. The display device of claim 18, wherein
the first metal plate and the second metal plate are spaced apart from each other, and
the bendable area is disposed between the first metal plate and the second metal plate.

20. The display device of claim 1, wherein the insulating layer includes a top surface and a bottom surface shaped corresponding to the groove patterns.

* * * * *